United States Patent
Kim et al.

(10) Patent No.: US 11,406,034 B2
(45) Date of Patent: Aug. 2, 2022

(54) DISPLAY APPARATUS AND METHOD FOR MANUFACTURING THEREOF

(71) Applicant: SAMSUNG ELECTRONICS CO., LTD., Suwon-si (KR)

(72) Inventors: Hyunsun Kim, Suwon-si (KR); Seungryong Han, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 66 days.

(21) Appl. No.: 16/592,297

(22) Filed: Oct. 3, 2019

(65) Prior Publication Data

US 2020/0113078 A1 Apr. 9, 2020

(30) Foreign Application Priority Data

Oct. 5, 2018 (KR) .......................... 10-2018-0119175

(51) Int. Cl.
*H05K 5/00* (2006.01)
*H05K 5/03* (2006.01)
*H01L 25/075* (2006.01)

(52) U.S. Cl.
CPC ........... *H05K 5/03* (2013.01); *H01L 25/0753* (2013.01); *H05K 5/0017* (2013.01); *H05K 5/0021* (2013.01)

(58) Field of Classification Search
None
See application file for complete search history.

(56) References Cited

U.S. PATENT DOCUMENTS

| 6,097,455 | A | 8/2000 | Babuka et al. |
| 6,370,019 | B1 | 4/2002 | Matthies et al. |
| 7,239,367 | B2 | 7/2007 | Jin et al. |
| 7,474,275 | B2 | 1/2009 | Sundahl |
| 8,791,474 | B1 * | 7/2014 | Bibl ............... G09G 3/3208 257/89 |

(Continued)

FOREIGN PATENT DOCUMENTS

| EP | 1226974 A1 | 7/2002 |
| KR | 10-2008-0003554 A | 1/2008 |

(Continued)

OTHER PUBLICATIONS

International Search Report (PCT/ISA/210) dated Oct. 10, 2019 issued by the International Searching Authority in International Application No. PCT/KR2019/008614.

(Continued)

*Primary Examiner* — Anthony Q Edwards
*Assistant Examiner* — Rashen E Morrison
(74) *Attorney, Agent, or Firm* — Sughrue Mion, PLLC (57) ABSTRACT

A method for manufacturing a display apparatus including a plurality of modular includes arranging the plurality of modular displays on a chassis, each modular display from among the plurality of modular displays comprising a respective plurality of pixels including a red inorganic light emitting element, a green inorganic light emitting element, and a blue inorganic light emitting element, forming a film on the plurality of modular displays, and forming a cover between light emitting elements of the plurality of modular displays by removing a region of the film corresponding to the light emitting elements of the plurality of modular displays.

11 Claims, 9 Drawing Sheets

(56) References Cited

U.S. PATENT DOCUMENTS

| | | | |
|---|---|---|---|
| 9,105,714 B2* | 8/2015 | Hu | H01L 24/95 |
| 9,111,464 B2* | 8/2015 | Bibl | H01L 33/501 |
| 9,252,375 B2* | 2/2016 | Bibl | H01L 24/24 |
| 9,293,475 B2 | 3/2016 | Shim et al. | |
| 9,425,173 B2* | 8/2016 | Rhee | H01L 25/0753 |
| 9,583,533 B2* | 2/2017 | Hu | H01L 25/0753 |
| 9,590,025 B2 | 3/2017 | Yu et al. | |
| 9,803,833 B2 | 10/2017 | Jepsen et al. | |
| 10,143,094 B2 | 11/2018 | Chin et al. | |
| 2002/0001051 A1 | 1/2002 | Krusius et al. | |
| 2005/0020175 A1 | 1/2005 | Tamashiro et al. | |
| 2005/0140569 A1 | 6/2005 | Sundahl | |
| 2006/0012733 A1 | 1/2006 | Jin et al. | |
| 2006/0116046 A1 | 6/2006 | Morley et al. | |
| 2007/0090387 A1* | 4/2007 | Daniels | H01L 24/75 257/E33.059 |
| 2008/0124659 A1 | 5/2008 | Park et al. | |
| 2009/0114928 A1* | 5/2009 | Messere | B32B 17/10761 257/E33.057 |
| 2009/0272950 A1* | 11/2009 | Lu | C09J 4/06 252/585 |
| 2010/0157210 A1 | 6/2010 | Rho et al. | |
| 2014/0078778 A1 | 3/2014 | Moriwaki et al. | |
| 2014/0367633 A1* | 12/2014 | Bibl | H01L 25/0753 257/13 |
| 2015/0221712 A1 | 8/2015 | Yu et al. | |
| 2017/0094815 A1 | 3/2017 | Chin et al. | |
| 2017/0256521 A1* | 9/2017 | Cok | H01L 23/49838 |
| 2018/0190631 A1 | 7/2018 | Kim et al. | |
| 2018/0277725 A1* | 9/2018 | Xiong | H01L 33/502 |

FOREIGN PATENT DOCUMENTS

| | | |
|---|---|---|
| KR | 10-1148791 B1 | 5/2012 |
| KR | 10-2015-0066058 A | 6/2015 |
| KR | 10-1580144 B1 | 12/2015 |
| KR | 10-2017-0037773 A | 4/2017 |
| KR | 10-1825608 B1 | 3/2018 |
| KR | 10-2020-0014057 A | 2/2020 |
| TW | 101235669 * | 2/2016 |
| WO | 2020/027460 A1 | 2/2020 |

OTHER PUBLICATIONS

Written Opinion (PCT/ISA/237) dated Oct. 10, 2019 issued by the International Searching Authority in International Application No. PCT/KR2019/008614.

International Search Report dated Jan. 22, 2020 issued by the International Searching Authority in counterpart International Application No. PCT/KR2019/012963 (PCT/ISA/210).

Written Opinion dated Jan. 22, 2020 issued by the International Searching Authority in counterpart International Application No. PCT/KR2019/012963 (PCT/ISA/237).

Communication dated Jul. 21, 2021, issued by the European Patent Office in European Application No. 19869815.1.

\* cited by examiner

DISPLAY APPARATUS AND METHOD FOR MANUFACTURING THEREOF

CROSS-REFERENCE TO RELATED APPLICATION(S)

This application is based on and claims priority under 35 U.S.C. § 119 to Korean Patent Application No. 10-2018-0119175, filed on Oct. 5, 2018, in the Korean Intellectual Property Office, the disclosure of which is incorporated by reference herein in its entirety.

BACKGROUND

1. Field

The disclosure relates to a display apparatus and a manufacturing method thereof and, more particularly, to a display apparatus composed of a plurality of modular displays and a manufacturing method thereof.

2. Description of Related Art

Recent developments in electronic technology have led to development of various display apparatuses. Recently, there has been an increasing demand for a large screen display apparatus, and there is an increasing amount of resources dedicated to development of a display apparatus having a large screen of 100 inches or more.

In the case of directly manufacturing a large screen display apparatus in a conventional manner of a liquid crystal display (LCD) or organic light emitting diode (OLED), there is a difficulty in mass production, as a problem such as a decrease in yield or the like occurs in a cell process and a thin film Transistor (TFT) deposition process.

When a large screen display apparatus is manufactured by modularizing a small screen display apparatus and then serially attaching a plurality of modular displays, there is an advantage that a problem of yield degradation which occurs when a large screen display apparatus is manufactured directly can be solved, and that a size of a screen can be customized according to a customer's demand.

However, in the case of tiling a plurality of modular displays, there are problems that a seam region may be formed between the plurality of modular displays, and a user may not recognize a display apparatus as an integral screen due to a difference in optical density and refractive index and may feel that the display apparatus looks unnatural.

When filling materials are applied to the seam region that have the same optical density and refractive index as the modular display, positional tolerance is gradually accumulated according to the number of times of arranging a plurality of modular displays, and accordingly, the material is not uniformly filled in the seam region. Therefore, there is a problem of increasing the visibility of the seam region due to the difference between the refractive index and the optical density with the modular display.

SUMMARY

Provided are a display apparatus to cover a seam region that is formed when a plurality of modular displays is arranged, enabling the seam region not to be identified by a user, and a manufacturing method thereof.

In accordance with an aspect of the disclosure, there is provided a method for manufacturing a display apparatus including a plurality of modular displays, the method including arranging the plurality of modular displays on a chassis, each modular display from among the plurality of modular displays comprising a respective plurality of pixels including a red inorganic light emitting element, a green inorganic light emitting element, and a blue inorganic light emitting element; forming a film on the plurality of modular displays; and forming a cover between light emitting elements of the plurality of modular displays by removing a region of the film corresponding to the light emitting elements of the plurality of modular displays.

The forming the cover may include forming the cover on edges of adjacent modular displays from among the plurality of modular display.

The forming the cover may include irradiating a portion of the film corresponding to the edges of the adjacent modular displays with a laser, and removing the region of the film except for the irradiated portion of the film.

The method may further include detecting, through an optical inspection, the portion of the film corresponding to a seam region formed between the adjacent modular displays.

The cover may covers a seam region formed between the adjacent modular displays, and fills at least a part of the seam region.

The film may include a base film and a transfer film attached to the base film, and the forming the film may include laminating the film on the plurality of modular displays so that the transfer film is disposed to face the plurality of modular displays.

The forming the cover may include forming the cover by removing the base film and a region of the transfer film on which the laser is not irradiated.

The transfer film may have a thickness based on height of the red inorganic light emitting element, the green inorganic light emitting element, and the blue inorganic light emitting element included in the plurality of pixels.

The forming the cover may include forming the cover between light emitting elements of the each modular display.

In accordance with an aspect of the disclosure, there is provided a display apparatus including a chassis; a plurality of modular displays arranged on the chassis such that a seam region is formed between adjacent modular displays from among the plurality of modular displays; and a processor configured to control the plurality of modular displays to display an image, wherein each modular display from among the plurality of modular displays includes a substrate; and a plurality of pixels comprising a red inorganic light emitting element, a green inorganic light emitting element, and a blue inorganic light emitting element, respectively, on the substrate, and a cover that covers the seam region and is attached to respective edges of the adjacent modular displays that define the seam region.

The cover may fill at least a part of the seam region between the respective edges of the adjacent modular displays.

The cover may include a transfer film that has been irradiated with a laser to attach the transfer film to the respective edges of the adjacent modular displays that define the seam region, and the transfer film may have a predetermined thickness depending on a height of the red inorganic light emitting element, the green inorganic light emitting element, and the blue inorganic light emitting element included in the plurality of pixels.

A width of the cover may be less than a distance between adjacent pixels from among the plurality of pixels, and may be greater than a distance between the adjacent modular displays from among the plurality of modular displays.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION

In the following description of the disclosure, a detailed description of known functions and configurations incorporated herein will be omitted when it may obscure the subject matter of the disclosure. In addition, the following embodiments may be modified in many different forms, and the scope of the technical spirit of the disclosure is not limited to the following examples. Rather, these embodiments are provided so that this disclosure will be thorough and complete, and will fully convey the technical spirit to those skilled in the art.

However, it should be understood that the present disclosure is not limited to the specific embodiments described hereinafter, but includes various modifications, equivalents, and/or alternatives of the embodiments of the present disclosure. In relation to explanation of the drawings, similar drawing reference numerals may be used for similar constituent elements.

The term such as "first" and "second" used in various example embodiments may modify various elements regardless of an order and/or of importance of the corresponding elements, and does not limit the corresponding elements.

In the description, the term "A or B", "at least one of A or/and B", or "one or more of A or/and B" may include all possible combinations of the items that are enumerated together. For example, the term "at least one of A or/and B" means (1) including at least one A, (2) including at least one B, or (3) including both at least one A and at least one B.

A singular expression includes a plural expression, unless otherwise specified. It is to be understood that the terms such as "comprise" or "include" are used herein to designate a presence of a characteristic, number, step, operation, element, component, or a combination thereof, and not to preclude a presence or a possibility of adding one or more of other characteristics, numbers, steps, operations, elements, components or a combination thereof.

If it is described that a certain element (e.g., first element) is "operatively or communicatively coupled with/to" or is "connected to" another element (e.g., second element), it should be understood that the certain element may be connected to the other element directly or through still another element (e.g., third element). On the other hand, if it is described that a certain element (e.g., first element) is "directly coupled to" or "directly connected to" another element (e.g., second element), it may be understood that there is no element (e.g., third element) between the certain element and the another element.

Also, the expression "configured to" used in the disclosure may be interchangeably used with other expressions such as "suitable for," "having the capacity to," "designed to," "adapted to," "made to," and "capable of," depending on cases. Meanwhile, the term "configured to" does not necessarily mean that a device is "specifically designed to" in terms of hardware. Instead, under some circumstances, the expression "a device configured to" may mean that the device "is capable of" performing an operation together with another device or component. For example, the phrase "a processor configured to perform A, B, and C" may mean a dedicated processor (e.g.: an embedded processor) for performing the corresponding operations, or a generic-purpose processor (e.g.: a CPU or an application processor) that can perform the corresponding operations by executing one or more software programs stored in a memory device.

Hereinafter, various embodiments of the disclosure will be described in greater detail with reference to the attached drawings.

Figure 1:
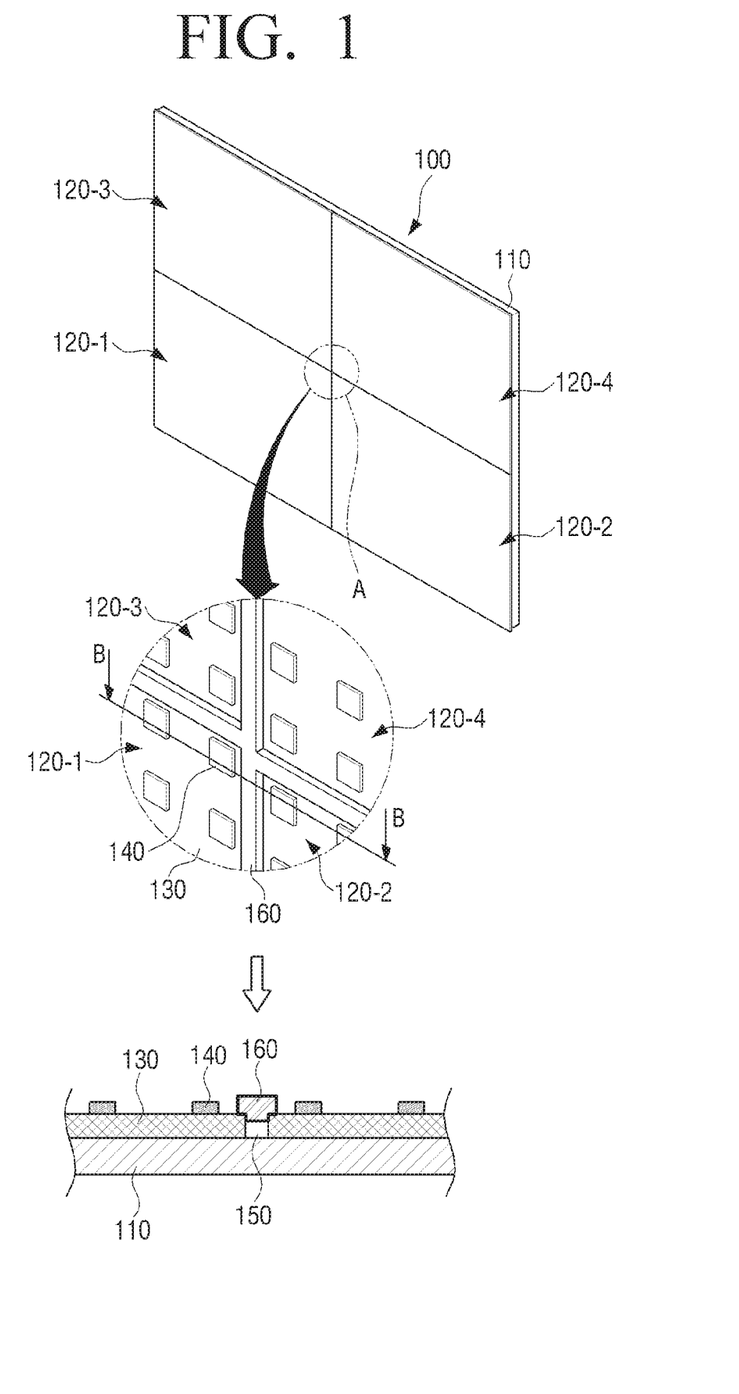
FIG. 1 is a view of a display apparatus according to an embodiment.

FIG. 1 is a view of a display apparatus according to an embodiment.

Referring to FIG. 1, a display apparatus 100 includes a plurality of modular displays 120-1, 120-2, 120-3, and 120-4 arranged on a chassis 110. FIG. 1 illustrates four modular displays, but this is merely for convenient description, and the embodiment is not limited thereto and may be diversified in a diverse manner. More than or fewer than four modular displays may be provided.

The chassis 110 may be coupled with the plurality of modular displays 120-1, 120-2, 120-3, and 120-4 and support the plurality of modular displays 120-1, 120-2, 120-3, and 120-4.

In this case, the chassis 110 may protect the plurality of modular displays 120-1, 120-2, 120-3, and 120-4 from the external environment, or perform a function to absorb light emitted from the modular display.

Here, the chassis 110 may be implemented as a metal material such as aluminum or a flexible material such as rubber, polyamide, or the like.

The plurality of modular displays 120-1, 120-2, 120-3, and 120-4 may be arranged on the chassis 110 and coupled, and each of the plurality of modular displays 120-1, 120-2, 120-3, and 120-4 may be directly or indirectly connected to adjacent modular displays.

In this case, the modular display may display an image. For example, a lower left modular display 120-1 may display a lower left region of the image, a lower right modular display 120-2 may display a lower right region of the image, an upper left modular display 120-3 may display an upper left region of the image, and an upper right modular display 120-4 may display an upper right region of the image.

In that each of the plurality of modular displays 120-1, 120-2, 120-3, and 120-4 has the same structure and functionality as each other modular display, a description of the modular display 120-1 may be equally applied to other modular displays 120-2, 120-3, and 120-4 included in the display apparatus 100.

Referring to a drawing in which the region A, which is a part of the display apparatus 100, of FIG. 1, is enlarged, the modular display 120-1 includes a substrate 130 and a pixel including a red inorganic light emitting element (e.g. red micro LED etc.), a green inorganic light emitting element (e.g. green micro LED etc.), and a blue inorganic light emitting element (e.g. blue micro LED etc.). That is, each modular display from among the plurality of modular displays 120-1, 120-2, 120-3, and 120-4 may include a respective plurality of pixels.

The substrate 130 may be in a form of a plate on which an electronic element such as resistance, a condenser, or the like, is fixed and an electronic circuit is composed by electrically connecting each electronic element.

In this case, a plurality of pixels each formed by including a red inorganic light emitting element, a green inorganic light emitting element, and a blue light inorganic light emitting element, respectively, may be formed.

Specifically, a driving circuit for driving the red inorganic light emitting element, the green inorganic light emitting element, and the blue inorganic light emitting element is formed on the substrate 130. The red inorganic light emitting element, the green inorganic light emitting element, and the blue inorganic light emitting element may be mounted on the driving circuit so as to be electrically connected to the driving circuit. In this case, the driving circuit may drive the red inorganic light emitting element, green organic light emitting element, and blue organic light emitting element to emit light. The substrate 130 may be formed of glass. However, this is merely an example, and the substrate 130 may be formed of polyimide, or the like.

In that each of the plurality of pixels has the same structure and functions, one pixel 140, from among a plurality of pixels, will be described as an example.

In an embodiment, the pixel 140 may include a plurality of subpixels. Here, the subpixel is a sub unit constituting a pixel, and each subpixel may be composed of an inorganic light emitting element.

Thus, the pixel 140 may represent or display an image by the combination of colors of light emitted by the red inorganic light emitting element, the green inorganic light emitting element, and the blue inorganic light emitting element. In other words, the red inorganic light emitting element, the green inorganic light emitting element, and the blue inorganic light emitting element may emit light and form the pixel 140 of the modular display 120-1.

For example, the pixel 140 may be composed of the red inorganic light emitting element, the green inorganic light emitting element, and the blue inorganic light emitting element.

In this case, the red inorganic light emitting element may include an inorganic light emitting element and a color filter, and white light emitted from the inorganic light emitting element may pass through the color filter including a red color phosphor to form a subpixel showing red color. Alternatively, a subpixel representing red color may be formed by emitting light having a wavelength of a red color in a light emitting element without a separate color filter. It is possible to form a subpixel representing green or blue color by applying different color filters or by emitting light having a wavelength of a green or blue color, respectively.

The red inorganic light emitting element, the green inorganic light emitting element, and the blue inorganic light emitting element may be implemented as a mini LED (light emitting diode) or a micro LED (light emitting diode). Here, the mini LED is a small inorganic light emitting element that emits light by itself, which means an LED chip having a size of about 100 to 200 micrometers. The micro LED is a micro-size inorganic light emitting element that emits light by itself, meaning an LED chip in a size about five to 100 micrometers.

Hereinbelow, it will be described that the red inorganic light emitting element, the green inorganic light emitting element, and the blue inorganic light emitting element according to an embodiment is implemented as a micro LED, for convenience of description.

In the above example, it has been described that one pixel 140 is composed of three inorganic light emitting elements, but this is merely an example, and the number and color, or the like, of the inorganic light emitting elements may be changed in a diverse manner.

In an embodiment, the pixel 140 may be composed of one inorganic light emitting element. In other words, one inorganic light emitting element may form one pixel 140. In this case, an inorganic light emitting element having a plurality of light emitting regions may emit light having a wavelength of different colors in each of the light emitting regions. For example, one inorganic light emitting element may emit red light in the first region, blue light in the second region, and green light in the third region to form one pixel.

The pixel 140 may be formed on the substrate 130, and a plurality of pixels may be arranged.

For example, a plurality of pixels may be arranged in a matrix form with pixels 140 formed at a constant interval on the substrate 130. In this case, the matrix may have the same number of rows and columns (for example, in the case of M=N, 1×1 array, 2×2 array, etc., where M, N is a natural number). However, this is merely an example, and the number of rows and columns may be different (for example, 2×3 arrays, 3×4 arrays, etc., in the case of M≠N, where M and N are natural numbers). However, this is merely an example, and the plurality of pixels may be arranged in various forms such as diamond shapes, delta shapes, S-stripe shapes, or the like.

Referring to an enlarged view of the area A, which is a part of the display apparatus 100 shown in FIG. 1, and a vertically cut view along the line B also shown in FIG. 1, a seam region 150 may be formed among a plurality of modular displays 120-1, 120-2, 120-3, and 120-4. A portion corresponding to the seam region 150 on a film formed on the plurality of modular displays may be transferred (or hardened, patterned), and a cover (or a cover portion) 160 which is formed by removing the remainder of the film except for the transferred portion may cover the seam region 150.

If a difference between the optical density of the cover 160 and the optical density of the remaining modular display parts except for the cover 160 is greater than or equal to a predetermined value, a user may feel unnatural in recognizing a screen of a display apparatus as an integrated screen. Therefore, in order to avoid this, a film having an optical density within a predetermined range (for example, +/−20%) based on an optical density of a plurality of modular display portions is transferred to a part which corresponds to the seam region 150, and the cover 160 may thus be formed.

Accordingly, the display apparatus 100 having the integrated screen in which the seam region 150 is covered by the cover 160 may be provided. In addition, the display apparatus in which the contrast ratio may be improved to realize the deep black, and color gamut is improved may be provided.

Hereinafter, a method for manufacturing the display apparatus 100 according to an embodiment and the structure of the display apparatus 100 will be described in further detail with reference to FIGS. 2, 3A, 3B, 4A, 4B, 5A, 5B, 6, 7A, 7B, and 8.

Figure 2:
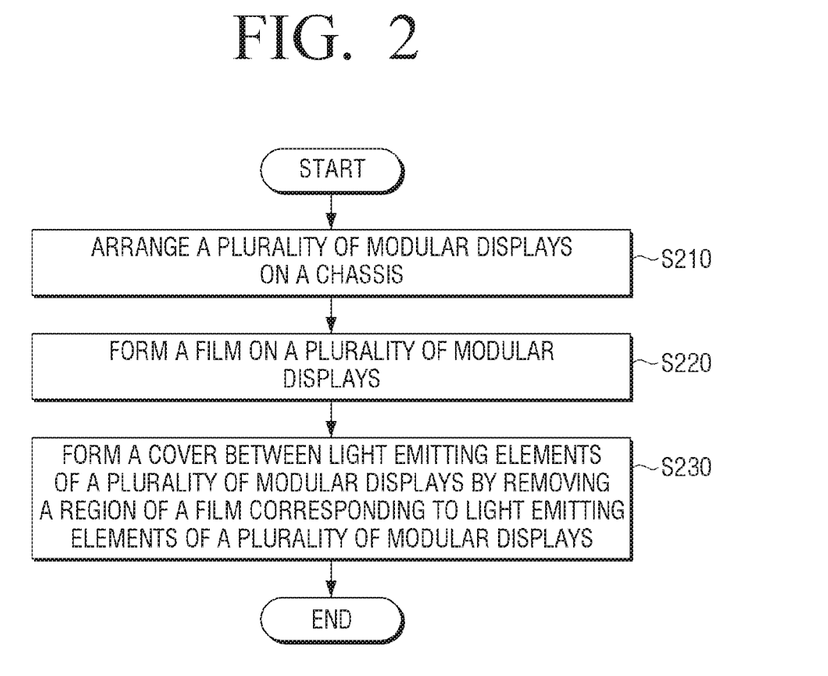
FIG. 2 is a flowchart of a method for manufacturing a display apparatus according to an embodiment.

FIG. 2 is a flowchart to describe a method for manufacturing a display apparatus according to an embodiment.

Referring to FIG. 2, the plurality of modular displays is arranged on the chassis in step S210.

The chassis 110 is for supporting the plurality of modular displays 120-1, 120-2, 120-3, and 120-4, and the size of the chassis 110 may be determined by the number and size of the plurality of modular displays 120-1, 120-2, 120-3, 120-4, or the like.

Figure 3A:
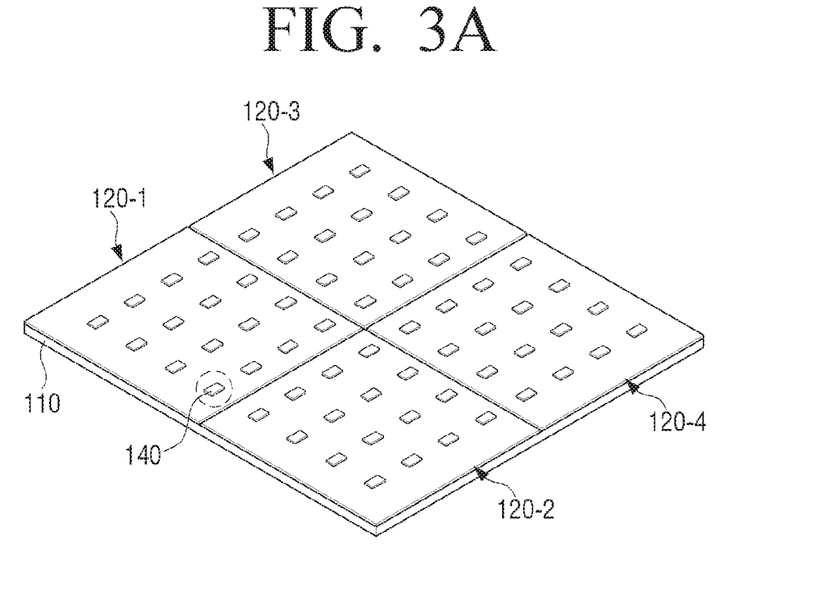
FIGS. 3A, 3B, 4A, 4B, 5A, 5B, 6, 7A, and 7B are views illustrating a method for manufacturing a display apparatus according to an embodiment.

Referring to FIG. 3A, the plurality of modular displays 120-1, 120-2, 120-3, and 120-4 may be arranged in a matrix form (for example, M×N, where M and N are natural numbers). As an embodiment, the plurality of modular displays may be arranged in an equal number of rows and columns (for example, where M=N, 3×3 array, 5×5 array, etc., where M and N are natural numbers). In an embodiment, the plurality of modular displays may be arranged in a different number of rows and columns. (For example, in the case of M≠N, 3×2 array, 5×4 array, etc., where M and N are natural numbers).

Figure 3B:
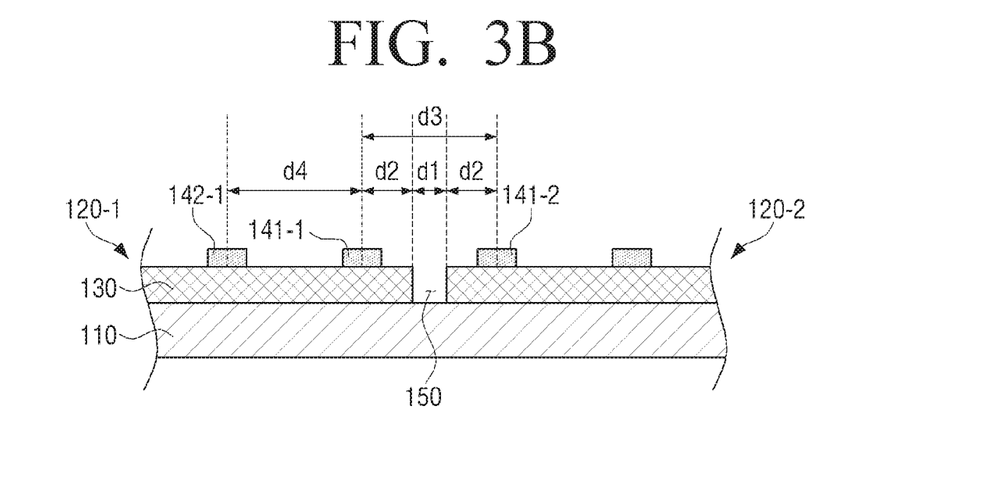

Referring to FIG. 3B, the plurality of modular displays 120-1 and 120-2 may be arranged on the chassis 110, and the seam region 150 may be formed between the modular displays 120-1 and 120-2 that are adjacent to each other.

The seam region 150 may be a region having the width d1 between the adjacent modular displays 120-1 and 120-2 and the thickness of the modular display 121 as the height.

To be specific, the width d1 of the seam region 150 is as specified below in Equation 1.

$$d1 = d3 - 2*d2 \quad \text{[Equation 1]}$$

Here, the distance between the center of a pixel 141-1, which is positioned on the modular display 120-1 adjacent to the seam region 150, and one side of the modular display 120-1 is d2, and the center distance (for example, the distance between the centers of pixels 141-1 and 141-2) of pixels 141-1 and 141-2 is d3, where pixel 141-1 is positioned on the modular display 120-1 and pixel 141-2 is positioned on the modular display 120-2.

The center distance d4 of pixels 141-1 and 142-1, which are adjacent pixels formed on a single modular display 120-1 as shown in FIG. 3B, may be equal to the center distance d3. In this case, degradation of image quality and unnaturalness to the naked eyes of a user may be minimized.

For this purpose, when the plurality of modular displays 120-1 and 120-2 are arranged on the chassis 110, the plurality of modular displays 120-1 and 120-2 may be arranged by determining the width d1 of the seam region 150 according to the distance d2 between the center of the pixel 141-1 and one side of the modular display 120-1, and the center distance d4 of the pixels 141-1 and 142-1 formed on the same modular display 120-1.

However, in some cases, the position error or tilt may occur in the process of arranging a plurality of modular displays, and an error may be gradually accumulated according to the number of arrangements, so that the width d1 of the seam region 150 may not be a uniform value (for example, 5 to 100 micrometers) across all seam regions.

However, according to an embodiment, even if the width d1 of the seam region 150 may not be uniformly formed, the seam region 150 may be effectively covered by using a transfer film and a laser, which will be described in more detail with reference to FIGS. 4A, 4B, 5A, 5B, and 6.

Referring to FIG. 2, a film is formed on a plurality of modular displays in step S220.

Figure 4A:
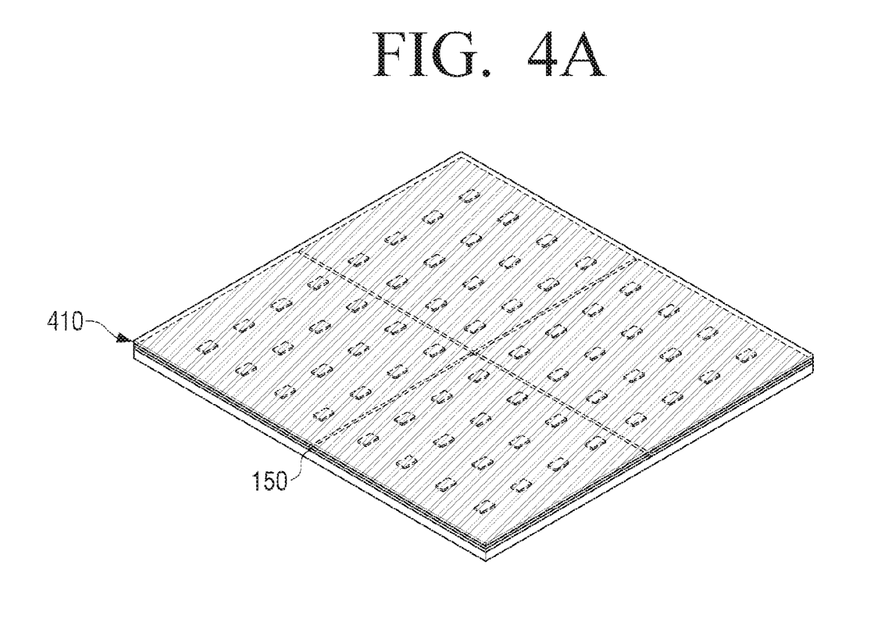

In this case, as shown in FIG. 4A, a film 410 may be formed on the plurality of modular displays and the seam region 150 so as to cover the plurality of modular displays and the seam region 150.

Figure 4B:
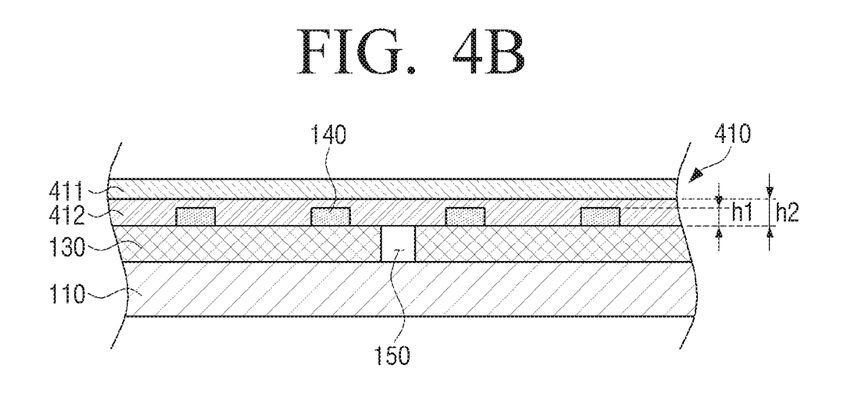

Referring to FIG. 4B, the film 410 may include a base film 411 and a transfer film 412. In this case, the transfer film 412 may be attached to the base film 411.

Specifically, the film 410 means a film made in the form of a dry film having a laminated structure including the base film 411 and the transfer film 412, or the like.

In this case, the base film 411 may be implemented with a transparent polymer material to prevent the transfer film 412 from being damaged or contaminated and to transfer light or light and heat to the transfer film 412. For example, the base film 411 may be implemented with polyester, polyacrylic, polyepoxy, polyethylene, polystyrene, or the like.

The transfer film 412 may include a photosensitive resin having photochemical reaction on a portion irradiated with light having a specific wavelength (for example, X-ray, ultra violet (UV), extreme UV (EUV), laser, or the like), photoinitiator, a thermosetting resin, or the like. The color of the transfer film 412 may be determined by a dye. According to an embodiment, the color of the transfer film 412 to cover the seam region 150 may be dark, such as black, and may have an optical density determined according to the optical density of the plurality of modular displays. However, the embodiment is not limited thereto and may be variously modified.

The film 410 may be formed on a plurality of modular displays and seam regions through a laminate. In this case, the laminate refers to a method of overlaying a film on the surface of an object to be laminated to form a layer.

To be specific, the film 410 may be laminated on the plurality of modular displays so that the transfer film 412 is disposed to face the plurality of modular displays.

For example, the film 410 may be attached to the plurality of modular displays using a roll laminate method by passing and pressing the plurality of modular displays and the film 410 formed on the plurality of modular displays between rollers. Alternatively, a vacuum may be used to compress the film 410 formed on the plurality of modular displays using a vacuum laminating method to attach the film 410 to the plurality of modular displays. However, the embodiment is not limited thereto, and this may be implemented in various ways, such as using rollers, a vacuum, heating or cooling, or the like, or any combination thereof.

After the film 410 is attached onto the plurality of modular displays, if there is a bubble between the film 410 and the plurality of modular displays, an autoclave method may be used to remove bubbles. For example, bubbles may be removed via a constant temperature pressure treatment process that applies pressure while maintaining a uniform temperature, or a heat press treatment process that applies pressure while raising the temperature, or the like.

As shown in FIG. 4B, transfer film 412 may have a predetermined thickness h2 according to the height h1 of the inorganic light emitting element 140. For example, as described below, a portion of transfer film 412 may be attached onto seam region 150 to cover the seam region 150. Accordingly, since the light angle emitted from the inorganic light emitting element 140 by the transfer film 412 attached on the seam region 150 may be limited, the transfer film 412 may have a predetermined thickness in accordance with the inorganic light emitting element 140. For example, the transfer film 412 may have a thickness of 1.5 times or less of the height of the inorganic light emitting element 140.

Referring back to FIG. 2, a cover between light emitting elements of the plurality of modular displays is formed by removing a region of the film corresponding to the light emitting elements of the plurality of modular displays in step S230.

Figure 5A:
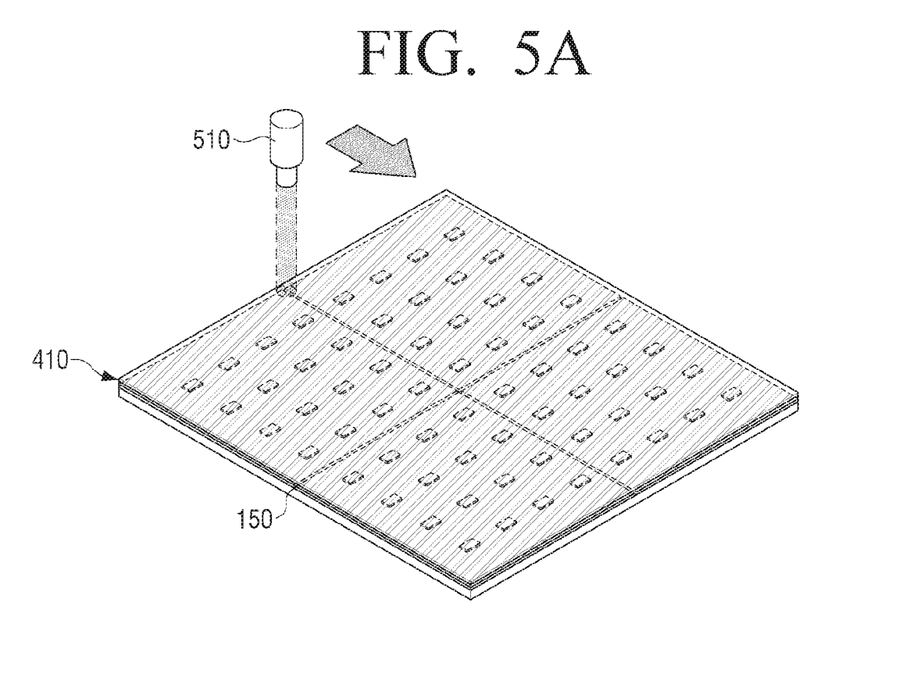
Figure 5B:
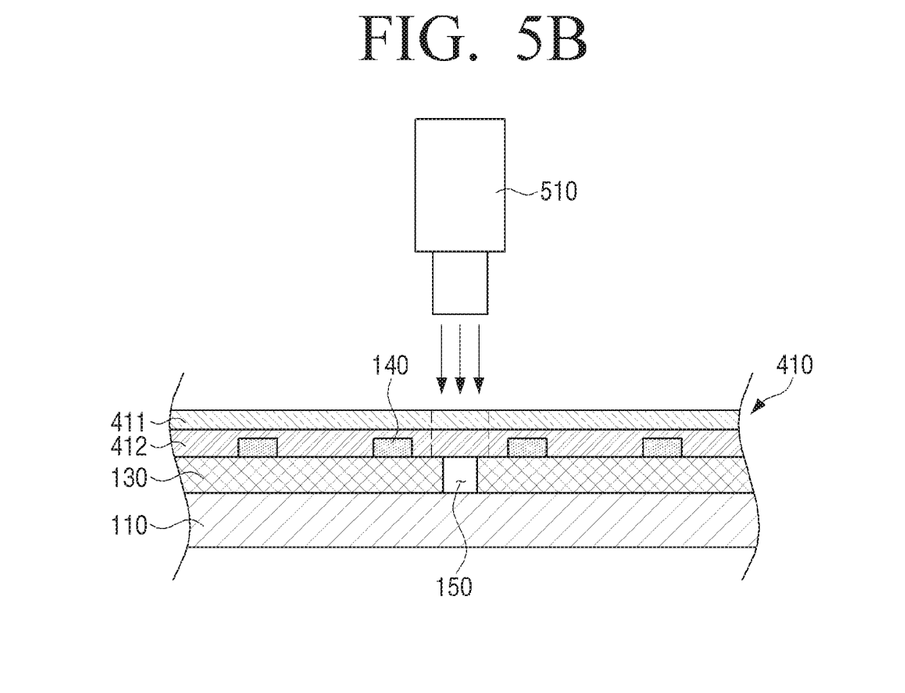

Referring to FIGS. 5A and 5B, a portion of the film 410 corresponding to the edges of the adjacent modular displays (e.g. the seam region 150 formed between the plurality of modular displays, etc.) may be irradiated with light (e.g. a laser, etc.), and the portion corresponding to the seam region 150 in the film 410 may be transferred. Here, a laser 510 is monochromatic light having straightness and may be implemented with a general laser, such as a solid laser, a gas laser, a semiconductor laser, a dye laser, or the like.

Specifically, the laser 510 may be radiated on a portion of the transfer film 412 through the base film 411. In order to prevent the transferred portion from being removed in the process of removing the base film 411, the transferred portion may be transferred so that the surface attached to the modular display may have a stronger adhesion force than the surface attached to the base film. In other words, the transferring a specific portion of the film may mean processing the specific portion of the film so that the adhesion of the specific portion is stronger than the adhesion of the other portion. For example, the transferring the specific portion may mean to enhance the adhesion of the specific portion for surface of the modular display or to weaken the adhesion of another portion for surface of the modular display.

In an embodiment, a photo-thermal conversion reaction may occur at the portion of the transfer film 412 irradiated with the laser 510 so that heat is released, and the portion corresponding to the seam region 150 may be transferred (or attached) on the surface of the modular display (i.e., edges of the adjacent modular displays) by the emitted heat. In an embodiment, a photo-chemical reaction may occur at the portion of the transfer film 412 irradiated with the laser 510, and the portion corresponding to the seam region 150 may be transferred (or attached) on the surface of the modular display. In other words, the laser 510 causes a chemical change that allows some of the transfer film 412 comprising a photoresist to be removed by a solution (i.e., a developer) according to a type (a negative type or a positive type) of the transfer film 412. In this case, if the type of the transfer film 412 is the positive type, the portion of the transfer film 412 irradiated with the laser 510 may become soluble in the solution. In other case, if the type of the transfer film 412 is the negative type, the portion of the transfer film 412 that has not been irradiated with the laser 510 (the remainder of the transfer film 412 except the portion of the transfer film 412 irradiated with the laser 510) may become soluble in the solution.

The portion of the film 410 corresponding to the seam region 150 is to cover the seam region 150, and may be transferred so as to have a width greater than the width of the seam region 150 and less than the distance between adjacent pixels from among the plurality of pixels.

As described above with reference to FIGS. 3A and 3B, when the width of the seam region 150 is different depending on the position, the width of the portion corresponding to the seam region 150 should be greater than the width of the seam region 150 itself. The width of the portion corresponding to the seam region 150 may vary depending on the position.

As an embodiment, the portion of the film 410 corresponding to the seam region 150 between the plurality of modular displays in the film 410 may be detected through the optical inspection, and the detected portion may be irradiated with the laser and a portion corresponding to the seam region 150 may be transferred (or attached) on edges of the adjacent modular displays 120-1 and 120-2.

Specifically, the optical inspection may detect the seam region 150 between a plurality of modular displays by photographing an image of the film 410 with a vision camera such as automatic optical inspection (AOI). In this case, the portion of the film 410 corresponding to the seam region 150 may be detected according to the detected seam region 150 and a plurality of inter-pixel distances. The optical inspection can be implemented by moire (stripes generated by frequency difference between wavelengths), halogen transmission, laser transmission, or the like.

Thereafter, the laser beam is radiated while moving the light source along the portion of the film 410 corresponding to the detected seam region 150, thereby transferring the portion of the film 410 corresponding to the seam region 150 from the film 410.

In an embodiment, prior to forming the film on the plurality of modular displays, an optical inspection may be performed to detect the seam region 150, and then, after forming a film on the plurality of modular displays, a laser may be radiated onto a portion of the film according to the detected seam region 150 so as to transfer the portion of the film corresponding to the seam region 150.

As such, radiating the laser 510 to a portion of the film 410 corresponding to the seam region 150 through an optical inspection effectively covers the seam region 150 with the film 410, the width of which may vary depending on the position due to a size tolerance of the modular displays or a tolerance which may be generated when arranging a plurality of modular displays on the chassis.

Figure 6:
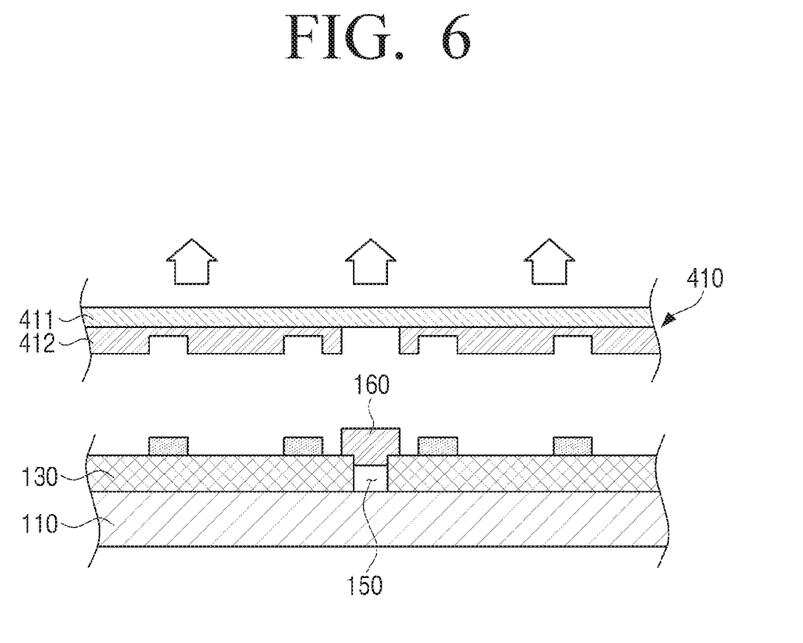

Referring to FIG. 6, the cover 160 may be formed by removing the base film 411 and a region of the transfer film 412 which has not been irradiated by a laser.

Specifically, removing the base film 411 may remove the base film 411 by applying a physical pressure upward with respect to the base film 411. The method of removing the base film 411 may be implemented with a vacuum adsorption method, a roll pressing method, or the like.

In this case, in the region (or portion) of the transfer film 412 that has not been irradiated with the laser, a surface attached to the modular display has a relatively weaker adhering force than the surface attached to the base film, and thus, when the base film 411 is removed, the portion of the transfer film 412 which has been not irradiated with the laser may be removed together.

Also, in the transferred portion, a surface attached to the modular display has a relatively stronger adhesive force than the surface attached to the base film and thus, when the base film 411 is removed, the portion transferred from the transfer film may not be removed.

Therefore, when the base film 411 is removed, the region (or the portion) of the transfer film 412 that has not been irradiated with the laser is removed together with the base film 411, and the portion of the transfer film irradiated with the laser beam remains attached to the modular display, and may form the cover 160 that may cover the seam region 150.

Figure 7A:
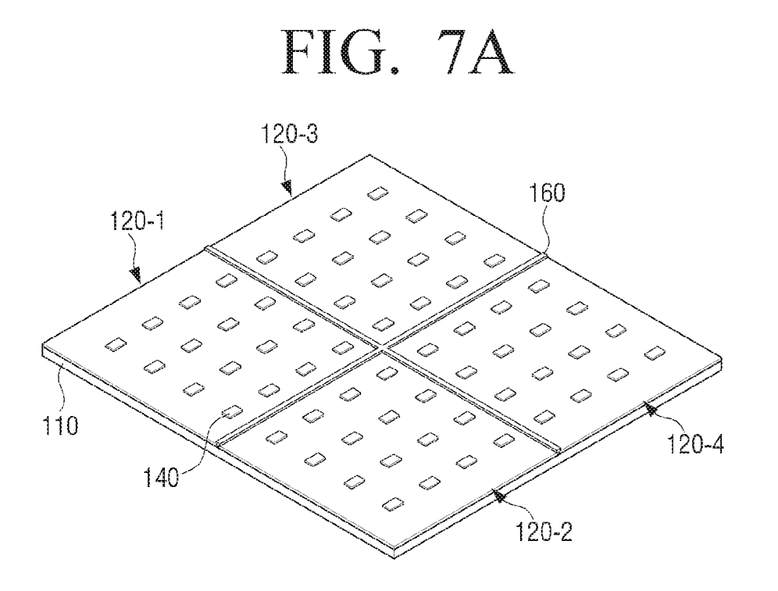
Figure 7B:
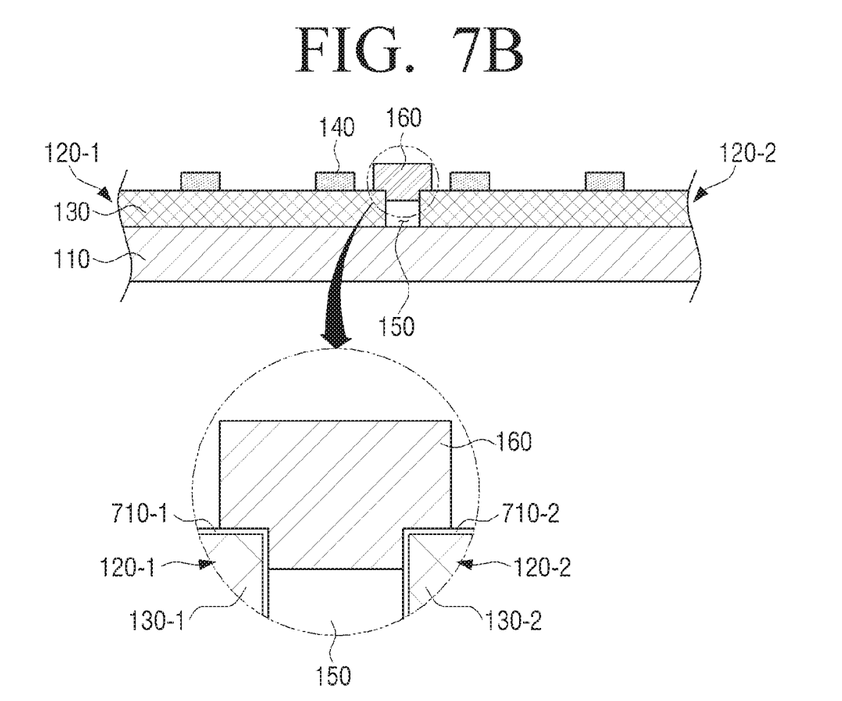

The display apparatus manufactured according to an embodiment, as shown in FIGS. 7A and 7B, may have the chassis 110, the plurality of modular devices 120-1, 120-2, 120-3, and 120-4 arranged on the chassis 110, and the cover 160 which covers the seam region formed between the plurality of the modular displays 120-1, 120-2, 120-3, and 120-4, regardless of the tolerances that occur in arranging the plurality of modular displays.

Referring to an enlarged view of the cover 160 of FIG. 7B, the cover 160 may be attached to the plurality of modular displays 120-1 and 120-2 to cover the seam region 150, and the cover 160 may be attached to the different modular displays 120-1 and 120-2 in the seam region 150 to fill at least a portion of the seam region 150.

Specifically, the cover which is formed in steps S230 of FIG. 2 may be attached to the sides (i.e., edges) of the different modular displays 120-1 and 120-2 in the seam region 150 to fill out at least a part of the seam region 150, thereby fixing the spacing of the plurality of modular displays 120-1 and 120-2 to be maintained constant.

Wires 710-1 and 710-2 may be formed on the outside of substrates 130-1 and 130-2 of the plurality of modular displays 120-1 and 120-2 as shown in FIG. 7B. For example, when the substrates 130-1 and 130-2 of the plurality of modular displays 120-1 and 120-2 are implemented with glass, it is difficult to form holes passing through the glass due to the glass characteristics. The wires 710-1 and 710-2 connecting the driving circuits disposed on an upper portion of the substrates 130-1 and 130-2 and the other circuits disposed below the substrates 130-1 and 130-2 may therefore be disposed on the sides of the substrates 130-1 and 130-2. In this case, since the cover 160 may be formed of an insulating material that does not conduct electricity, the cover 160 may maintain the spacing between the plurality of modular displays 120-1 and 120-2 and the seam region 150 so as to prevent the respective wires 710-1 and 710-2 formed in the plurality of different modular displays 120-1 and 120-2 from being short-circuited.

Figure 8:
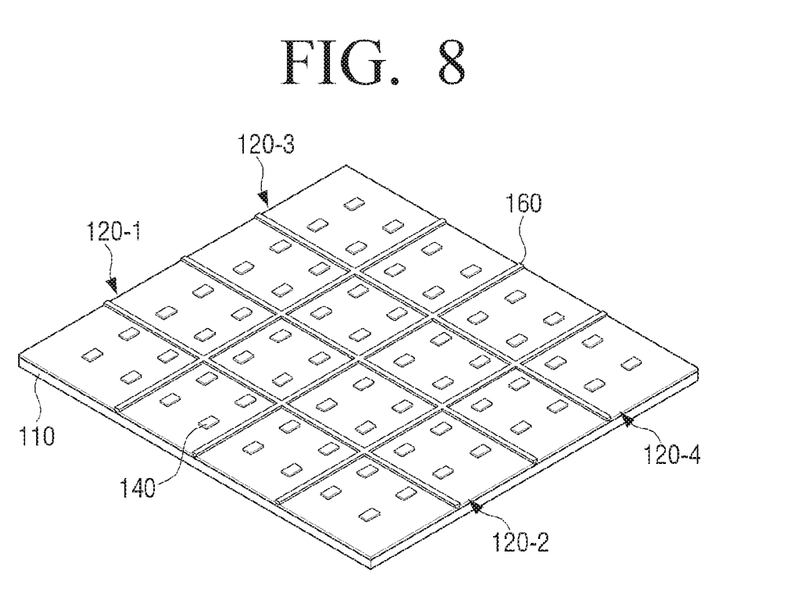
FIG. 8 is a view illustrating an additional method of manufacturing a display apparatus according to an embodiment.

FIG. 8 is a view showing an additional method of manufacturing a display apparatus according to an embodiment.

Referring to FIG. 8, prior to removing the remainder of the film except for the transferred portion, a portion corresponding to at least one pixel formed on each of a plurality of modular displays in the film may be transferred. In other words, the forming the cover may include forming the cover between light emitting elements of the each modular display.

Specifically, a portion corresponding to at least one pixel may be a boundary portion of a matrix including at least one pixel among a plurality of pixels formed at regular intervals. In this case, the matrix may have the same number of rows and columns (for example, in the case of M=N, 1×1 array, 2×2 array, or the like, where M and N are natural numbers). However, this is merely an example, and the number of rows and columns may be different (for example, in the case of M≠N, 2×3 array, 3×4 array, or the like, where M and N are natural numbers). However, this is only an embodiment, and a portion corresponding to at least one pixel may be implemented in various forms as a portion not covering the upper portion of the pixel.

For this purpose, when the seam region between a plurality of modular displays in a film is detected through an optical inspection, information such as the position and size of the plurality of pixels formed in each of the plurality of modular displays may be detected according to the information such as the detected seam region, the size of a predetermined modular display, the position, number, size, and spacing of pixels formed in the modular display, or the like.

Thereafter, a portion corresponding to the seam region 150 may be transferred from the film 410 by irradiating the film 410 with the laser while moving the light source emitting the laser along the region corresponding to the detected seam region 150, and then, the display apparatus illustrated in FIG. 8 may be manufactured in which the cover 160 is formed, by removing the remainder of the film except for the transferred portion.

According to the embodiment described above, the cover 160 may be formed symmetrically and repeatedly at regular intervals between a plurality of pixels, and accordingly, a user may feel a feeling of proportionality, uniformity, or the like. Therefore, it is possible to provide a display apparatus with which a user is capable of more effectively recognizing a screen of a plurality of modular displays as an integrated screen.

Figure 9:
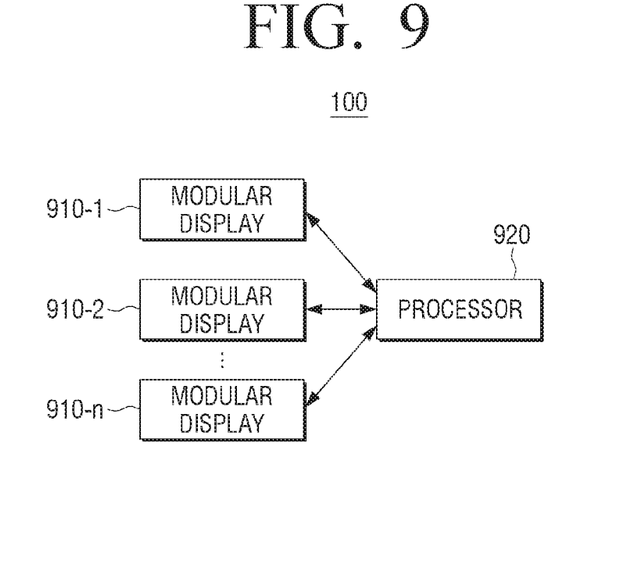
FIG. 9 is a block diagram of a display apparatus according to an embodiment.

FIG. 9 is a block diagram of a display apparatus according to an embodiment.

Referring to FIG. 9, the display apparatus 100 includes a plurality of modular displays 910-1, 910-2, . . . , 910-$n$ and a processor 920.

The plurality of modular displays 910-1, 910-2, . . . , 910-$n$ may each include a plurality of pixels composed of a red inorganic light emitting element, a green inorganic light emitting element, and a blue inorganic light emitting element, and a specific description of the plurality of modular displays 910-1, 910-2, . . . , 910-$n$ has been given with respect to FIG. 1.

Also, the plurality of modular displays 910-1, 910-2, . . . , 910-$n$ may be arranged in a matrix form on the chassis, where the seam region formed between the plurality of modular displays 910-1, 910-2, . . . , 910-$n$ may be covered by a portion of the film attached to the plurality of modular displays, as a portion corresponding to the seam region is transferred from the film formed on the plurality of modular displays and the seam region.

The transfer film may be determined to have a preset thickness based on the height of the red inorganic light emitting element, the green inorganic light emitting element, and the blue inorganic light emitting element included in the plurality of pixels. The specific details of covering the seam region using a film has been described above.

A processor 920 controls overall operations of the display apparatus 100. For this purpose, the processor 920 may include one or more of a central processing unit (CPU), an application processor (AP), or a communication processor (CP).

The processor 920 may control the plurality of modular displays 910-1, 910-2, . . . , 910-$n$ to display an image.

The image may be received from an external device, or prestored in a storage of a display apparatus 100.

Specifically, the processor 920 may control the plurality of modular displays 910-1, 910-2, . . . , 910-$n$ to crop an image corresponding to its position in the display apparatus 100 by the plurality of modular displays 910-1, 910-2, . . . , 910-$n$, and play the cropped image.

For example, the processor 920 may divide an image into a plurality of regions based on the number of modular displays constituting the display apparatus 100, and a format of arranging the modular displays in the display apparatus 100, or the like, and display the divided image on the modular display existing at the corresponding position.

For example, the processor 920 may display an image in a region positioned in the top left side in the plurality of regions on the modular display positioned din the top left side of the display apparatus 100.

Accordingly, the processor 920 may display the entire image through the plurality of modular displays 910-1, 910-2, . . . , 910-$n$.

Each modular display may be provided with a timing controller for controlling an inorganic light emitting element of the modular display to display an image. Each modular display may display an image through a pixel, under the control of the processor 920. However, this is merely an example, and the timing controller may be provided by cabinets composed of the predetermined number of modular displays, and under the control of the processor 920, the timing controller may control the modular display included in each cabinet and display an image through the pixel.

While embodiments have been shown and described, the disclosure is not limited to the specific embodiments, and it is to be understood that the disclosure is not limited to the specific embodiments as described above. It will be understood by those of ordinary skill in the art that various changes in form and details may be made therein without departing from the spirit and scope as defined by the following claims and their equivalents.

What is claimed is:

1. A method for manufacturing a display apparatus comprising a plurality of modular displays, the method comprising:
    arranging the plurality of modular displays on a chassis, each modular display from among the plurality of modular displays comprising a plurality of pixels, and each pixel from among the plurality of pixels comprising a red inorganic light emitting element, a green inorganic light emitting element, and a blue inorganic light emitting element;
    forming a film on the plurality of modular displays;
    irradiating a portion of the film corresponding to edges of adjacent modular displays from among the plurality of modular displays with a laser; and
    forming a cover on the edges of the adjacent modular displays by removing a region of the film except for the irradiated portion of the film.

2. The method of claim 1, the method further comprising: detecting, through an optical inspection, the portion of the film corresponding to a seam region formed between the adjacent modular displays.

3. The method of claim 1, wherein the cover covers a seam region formed between the adjacent modular displays, and fills at least a part of the seam region.

4. The method of claim 1, wherein the film comprises a base film and a transfer film attached to the base film, and
    wherein the forming the film comprises laminating the film on the plurality of modular displays so that the transfer film is disposed to face the plurality of modular displays.

5. The method of claim 4, wherein the forming the cover comprises forming the cover by removing the base film and a region of the transfer film which has not been irradiated by the laser.

6. The method of claim 4, wherein the transfer film has a thickness based on to a height of the red inorganic light emitting element, the green inorganic light emitting element, and the blue inorganic light emitting element.

7. The method of claim 1, wherein the forming the cover comprises forming the cover between the light emitting elements of each modular display of the plurality of modular displays.

8. A display apparatus comprising:
    a chassis;
    a plurality of modular displays arranged on the chassis such that a seam region is formed between adjacent modular displays from among the plurality of modular displays;
    a processor configured to control the plurality of modular displays to display an image, each modular display from among the plurality of modular displays comprising:
        a substrate; and
        a plurality of pixels, each pixel from among the plurality of pixels comprising a red inorganic light emitting element, a green inorganic light emitting element, and a blue inorganic light emitting element, respectively, on the substrate; and
    a cover that covers the seam region and is attached to respective edges of the adjacent modular displays that define the seam region,
    wherein substrates of the adjacent modular displays from among the plurality of modular displays are spaced apart from each other by a gap defining the seam region,
    wherein a size of the chassis is determined based on a number of the plurality of modular displays and a size of the plurality of modular displays.

9. The display apparatus of claim 8, wherein the cover fills at least a part of the seam region between the respective edges of the adjacent modular displays.

10. The display apparatus of claim 8, wherein the cover comprises a transfer film that has been irradiated with a laser to attach the transfer film to the respective edges of the adjacent modular displays that define the seam region, and
    wherein the transfer film has a thickness based on a height of the red inorganic light emitting element, the green inorganic light emitting element, and the blue inorganic light emitting element.

11. The display apparatus of claim 8, wherein a width of the cover is less than a distance between adjacent pixels from among the plurality of pixels, and is greater than a distance between the respective edges of the adjacent modular displays from among the plurality of modular displays.

* * * * *